(12) United States Patent
Delaye et al.

(10) Patent No.: US 8,938,700 B1
(45) Date of Patent: Jan. 20, 2015

(54) DATA-DRIVEN PATTERN MATCHING IN SYNTHESIS OF CIRCUIT DESIGNS

(71) Applicant: Xilinx, Inc., San Jose, CA (US)

(72) Inventors: Elliott Delaye, San Jose, CA (US);
Alireza S. Kaviani, San Jose, CA (US);
Ashish Sirasao, San Jose, CA (US);
Yinyi Wang, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 13/762,251

(22) Filed: Feb. 7, 2013

(51) Int. Cl.
*G06F 17/50* (2006.01)

(52) U.S. Cl.
CPC .................. *G06F 17/505* (2013.01)
USPC ........................................ 716/104; 716/132

(58) Field of Classification Search
CPC .................. G06F 17/50; G06F 9/455
USPC .................................................. 716/104, 132
See application file for complete search history.

(56) References Cited

U.S. PATENT DOCUMENTS 7,512,271 B2 * 3/2009 Matsugu et al. ............... 382/181
8,006,204 B2 * 8/2011 Killian et al. .................. 716/100

* cited by examiner

*Primary Examiner* — Thuan Do
(74) *Attorney, Agent, or Firm* — LeRoy D. Maunu (57) ABSTRACT

Data-driven processing of a circuit design includes converting each pattern of one or more input patterns from a first format into a second format. Each pattern identifies one or more inputs and one or more outputs and specifies each function that generates each of the one or more outputs from the one or more inputs. Each pattern of the second format is stored in a database. An input circuit design is searched for circuit design elements that match patterns in the database. Data indicative of each pattern in the database that matches a circuit design element is output.

20 Claims, 5 Drawing Sheets

DATA-DRIVEN PATTERN MATCHING IN SYNTHESIS OF CIRCUIT DESIGNS

TECHNICAL FIELD

The disclosure generally relates to data-driven synthesis of circuit designs.

BACKGROUND

Programmable logic devices (PLDs) are a well-known type of programmable integrated circuit (IC) that can be programmed to perform specified logic functions. One type of PLD, the field programmable gate array (FPGA), typically includes an array of programmable tiles. These programmable tiles comprise various types of logic blocks, which can include, for example, input/output blocks (IOBs), configurable logic blocks (CLBs), dedicated random access memory blocks (BRAM), multipliers, digital signal processing blocks (DSPs), processors, clock managers, delay lock loops (DLLs), bus or network interfaces such as Peripheral Component Interconnect Express (PCIe) and Ethernet and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

The configuration data for programming an FPGA is generated by using design tools to prepare and compile a high-level circuit design. The tools generally synthesize the high-level design into a netlist, map elements of the netlist to resources of the target device, and place and route the mapped resources on particular resources of the target device. For devices such as FPGAs, synthesis tools may be programmed with hardcoded patterns for finding structures such as digital signal processors (DSPs), multiplexers, adders, or combinations of objects in the design, and mapping those structures to particular device resources. The particular mappings of structures to resources may be optimized for speed, area, or power consumption, for example.

SUMMARY

A data-driven method of processing a circuit design includes inputting one or more input patterns in a first format to a programmed processor. Each pattern of the one or more input patterns is converted from the first format into a second format. Each pattern identifies one or more inputs and one or more outputs and specifies each function that generates each of the one or more outputs from the one or more inputs. Each pattern of the second format is stored in a database. For an input circuit design, the method searches for circuit design elements in the circuit design that match patterns in the database. Data indicative of each pattern in the database that matches a circuit design element is output.

A system for data-driven processing of a circuit design is also described. The system includes a processor and a memory arrangement coupled to the processor. The memory arrangement is configured with instructions that when executed by the processor cause the processor to perform operations including inputting one or more input patterns in a first format to a programmed processor. Each pattern of the one or more input patterns is converted from the first format into a second format by the programmed processor. Each pattern identifies one or more inputs and one or more outputs and specifies each function that generates each of the one or more outputs from the one or more inputs. Each pattern of the second format is stored in a database. For an input circuit design, the processor searches for circuit design elements in the circuit design that match patterns in the database. The processor outputs data indicative of each pattern in the database that matches a circuit design element.

Other embodiments will be recognized from consideration of the Detailed Description and Claims, which follow.

BRIEF DESCRIPTION OF THE DRAWINGS

Various aspects and advantages of the disclosed embodiments will become apparent upon review of the following detailed description and upon reference to the drawings, in which.

DETAILED DESCRIPTION

Approaches that allow circuit designers to customize the patterns the synthesizer searches for in synthesizing a circuit design are described. Along with one or more patterns, the circuit designer may associate particular implementations with the patterns. For parts of a circuit design that match the custom patterns, the synthesizer may use the associated implementations in generating netlists for those parts of the design. The designer-provided implementations may optimize for speed, area, or power consumption, for example. Since the software developers who made the synthesis tool may have incomplete knowledge of the optimizations that are desirable for the many different applications of circuit designs that may be processed by the synthesis tool, it is desirable to allow the designers of those applications to customize the patterns recognized by the synthesis tool and provide associated implementations in order to improve the implemented circuit designs.

Figure 1:
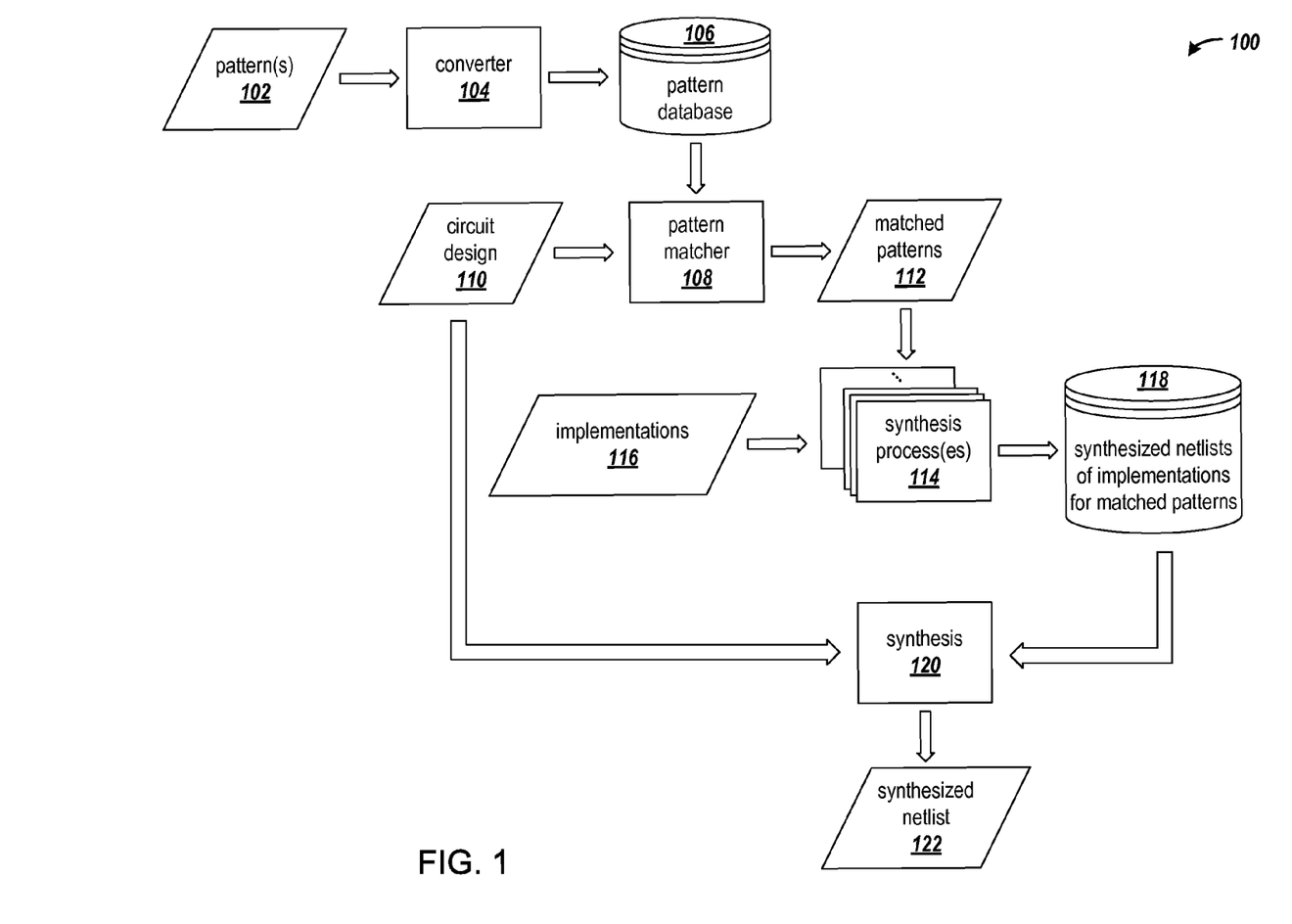
FIG. 1 shows a system for using data-driven pattern recognition to analyze a circuit design and for customizing the implementation of selected circuit design elements.

FIG. 1 shows a system 100 for using data-driven pattern recognition to analyze a circuit design and for customizing the implementation of selected circuit design elements. A circuit designer inputs one or more patterns 102 to a converter 104, and the converter converts the patterns from an input format to a format suitable for storage in pattern database 106. The converter 104 permits the circuit designer to specify a pattern that matches a structure of the circuit design that the synthesis tool is not hardcoded to recognize. For example, the designer may have a specialized FIFO structure or an arithmetic structure that the synthesis tool would not detect without the designer-provided pattern. The format of the input pattern may be in register transfer language (RTL), for example. Using RTL allows the designer to specify the structure of the pattern without specifying the sizes of elements in the pattern, thereby providing applicability to a broad range of structures in circuit designs. In addition to RTL, circuit designers may use conversion programs to convert C or C++ into RTL and then into input patterns. Another possible way of producing an input pattern would be a graphical user interface that lets users drag and drop representative circuit elements that represent features of the desired pattern. Circuit designers also may directly write the file format used by the pattern database 106.

The input patterns may alternatively be generated by running synthesis on sample circuit designs. For example, the synthesis tool may identify structures in a design that satisfy certain criteria such as circuit structures that require the largest portions of the total area of the circuit design, circuit structures of which the circuit design has the largest numbers of instances, or circuit structures having the greatest contributions to delays in the circuit timing. The patterns may be seeded on a single operation in the circuit and grown to identify larger structures. Once structures are identified, they can be written as patterns in a pattern database, and the numbers of instances of the circuit structures in the circuit design may be reported.

For an RTL format, each pattern specifies a module, including the input and output signals of the module, along with operators and functions internal to the module. The format in which the pattern is stored in the pattern database 106 is language independent while retaining identification of the input and output signals and the operators and functions internal to the module. In one embodiment, a structure or element of the circuit design would match the pattern if the structure contains all the input and output signals and internal operations and functions specified by the pattern. In another embodiment, the pattern may be specified such that structures that are inexact matches to the pattern are deemed to match the pattern. For example, if the pattern contains an operation X+Y+Z, it could be designated to match the element A+B in the circuit design by defining the pattern as "M+N matches X+Y+Z if input Z is replaced with 0." This permits a pattern to match a variety of structures.

The pattern matcher 108 inputs a circuit design 110 and searches for matches between structures in the circuit design and patterns in the pattern database 106. The patterns that match structures in the circuit design are indicated as matched patterns 112. The implementation details of each matching structure, for example, bus sizes, are stored in association with the indication of each instance of a matched pattern. Implementation parameter values are read from the circuit design for both exact pattern matches and inexact pattern matches. Each inexact pattern match produces implementation parameters to describe the non-exact match.

The matched patterns 112 may be stored in a database in which the instances of matched patterns are indexed by a pattern identifier and/or parameter values such as bus sizes. This information may be useful in analyzing and exploring different options for the architecture of the circuit design.

Each pattern in the pattern database 106 may be associated with a corresponding single or a set of implementations 116. The implementations of the patterns may be optimized for timing, area, or power, for example. Also, different implementations may be provided for different target devices.

Multiple synthesis processes 114 may be run in parallel to generate synthesized netlists of implementations 118 of the matched patterns 112. For each one of matched patterns 112, one of the synthesis processes 114 generates a synthesized netlist using the parameter values stored in association with the matched patterns 112 as the parameter values for the associated one of implementations 116. The resulting synthesized netlist is stored in database 118.

The time required for synthesis of the implementations may be reduced for multiple instances of a structure in the circuit design that match the same pattern and that have the same parameter values by reusing the synthesized netlist for each of the implementations. Only one synthesized netlist of the implementation needs to be stored in the database 118, and that synthesized netlist may be replicated as many times as needed by the synthesis component 120 in generating the overall synthesized netlist 122.

The synthesis component 120 generates the synthesized netlist 122 from the circuit design 110 and the synthesized netlists in the database 118. For each synthesized netlist in the database 118, the synthesis tool uses that netlist instead of synthesizing a netlist from the corresponding structure in the circuit design 110.

Figure 2:
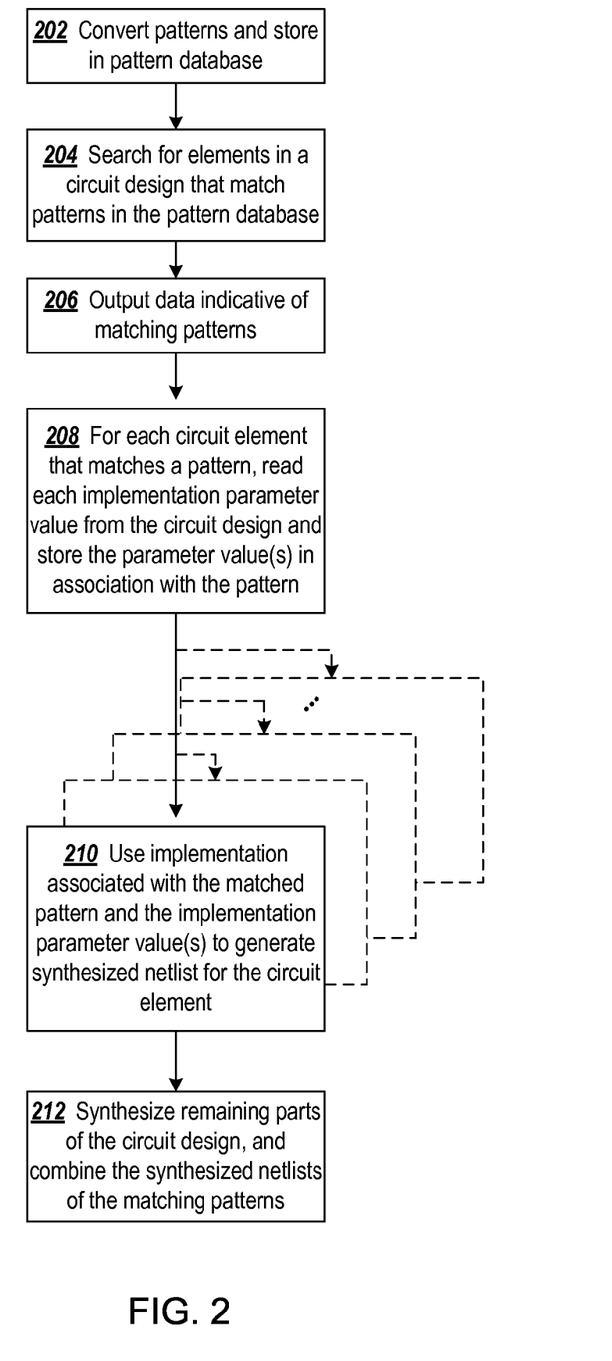
FIG. 2 shows a flowchart of a process for data-driven analysis of a circuit design and customizing the implementation of selected circuit design elements.

FIG. 2 shows a flowchart of a process for data-driven analysis of a circuit design and customizing the implementation of selected circuit design elements. At block 202, patterns specified by a circuit designer are converted and stored in a pattern database. In an example implementation, the patterns are specified using RTL. The pattern database contains each pattern represented as a graph having nodes representing circuit operations and edges representing circuit connections. Each pattern in the pattern database has a unique signature based on the name, inputs, outputs, and parameters. Example 1 shows a pattern having input signals A and B and an output signal out. The value of out depends on whether A is greater than B. The pattern has no sizes of registers or busses as those values will be taken from a matching structure of the circuit design. In an example implementation, the RTL used as a pattern is syntactically correct and synthesizable RTL as would be accepted by conventional synthesis tools. A pattern may have additional directives that are used by the pattern converter 104. For example, many common patterns do not need the register or bus sizes since pattern implementations may be customized to the circuit. However directives to the pattern converter 104 may include indicating to the converter 104 that register and bus sizes specified in the pattern are to be exactly matched.

```
module CustomGT(A, B, out);
   input A,B;
   output out;
   reg out;
   always@(*)
     if(A>B)
        out=1;
     else
        out=0;
endmodule // custom
```

Example 1

At block 204, the process searches for elements in the circuit design that match patterns in a pattern database, and at block 206 the process outputs data indicative of matching patterns. To aid in architecture exploration, the output data may identify matched patterns and indicate numbers of elements in the circuit design that match the patterns.

Example 2 shows elements from the circuit design that match the pattern of Example 1. One matching element includes the always and if-else code for input signals a and b. The other matching elements include the always and if-else code for input signals c and d.

```
module top(a,b,c,d,r1,r2);
    input [99:0] a,b;
    input [4:0] c,d;
    output r1,r2;
    reg r1,r2;
    always@(a,b)
        if(a>b)
r1=1;
        else
r1 =0;
    always@(c,d)
        if(c>d)
r2=1;
        else
r2=0;
endmodule
```

Example 2

For matching patterns that have associated implementations, at block 208 the parameter values of the matching circuit design elements are read from the circuit design and stored in association with the matching patterns. For each pattern that matches multiple elements in the circuit design, a respective set of parameter values is stored in association with the pattern. Example 3 shows an example implementation associated with the pattern of Example 1. The example implementation generates different circuitry depending on the size of the inputs. If the input A has a bus width less than thresh, one version of the circuit is generated. Otherwise, another version of the circuit is generated in which the inputs A and B are split in performing the comparisons.

```
module CustomGT(A, B, out);
    parameter widthA=1 ;
    parameter widthB=1 ;
    parameter widthout=1 ;
    parameter thresh=51 ;
    input+widthA-1 :0+A;
    input +widthB-1 :0+ B;
    output out;
    reg res;
    assign out=(widthA==widthB)?res:0;
    generate
        if(widthA<thresh)
            always@(A,B)
                if(A>B)
                    res=1 ;
                else
                    res=0;
        else
            always@(A,B)
                if(A[widthA-1:widthA/2]>B[widthA-1:width B12])
                    res=1 ;
                else if(A[widthA-1:widthA/2]<B[widthA-1:widthB/12])
                    res=0;
                else
                    if(A[widthA/2-1:0]>B[width B/2-1:0])
                        res=1 ;
                    else
                        res=0;
    endgenerate
end module
```

Example 3

At block 210, synthesized netlists are generated from the implementations associated with the matched patterns and the implementation parameter values obtained from the matching elements in the circuit design. Independent parallel processes may be used to generate the synthesized netlists. For example, a first process may generate a synthesized netlist from one implementation associated with a matching pattern, and in parallel with the first process, a second process may generate another synthesized netlist from another implementation associated with another matching pattern. At block 212, the rest of the circuit design is synthesized and combined with the synthesized netlists generated from implementations of the matched patterns.

Figure 3:
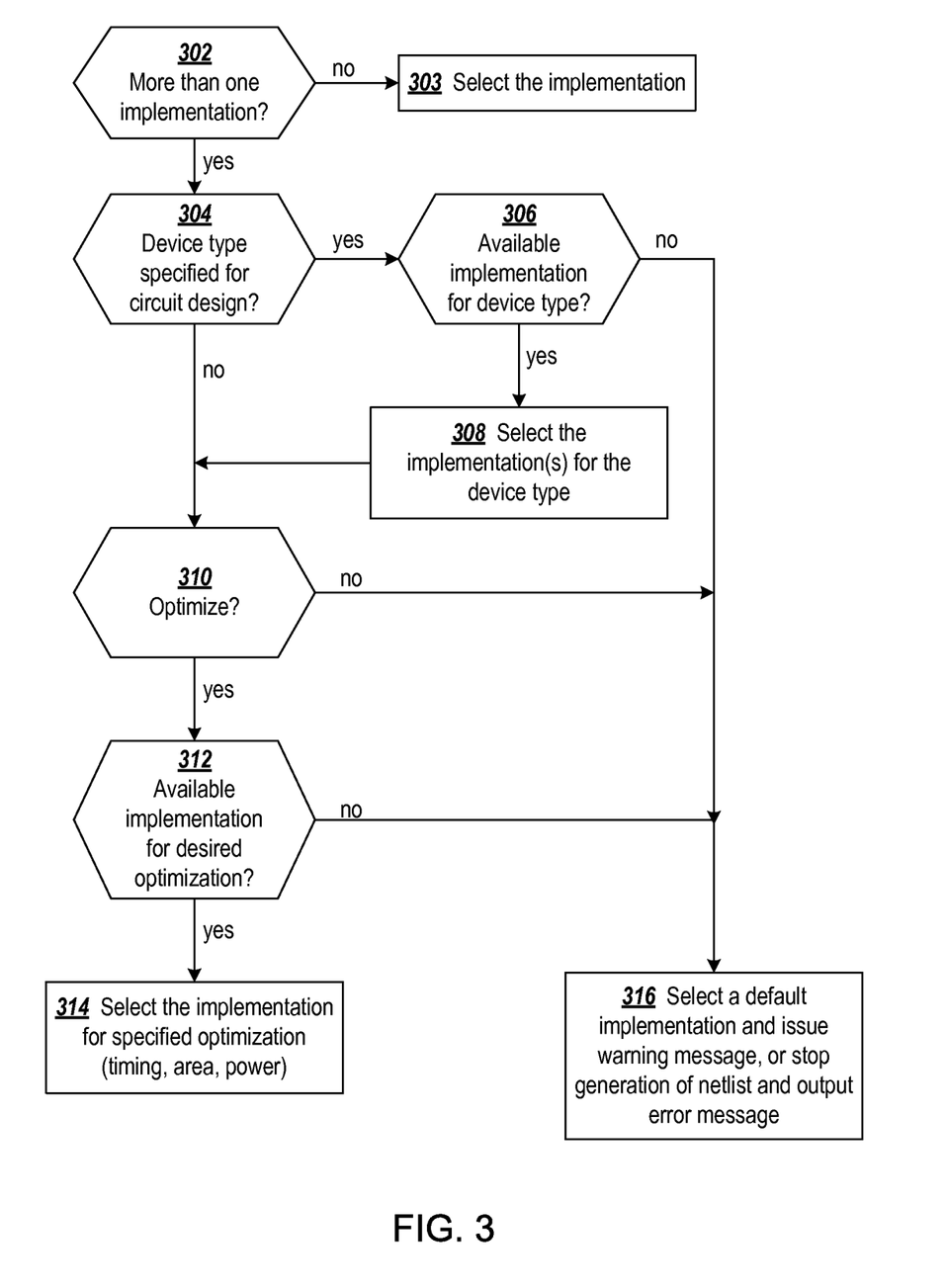
FIG. 3 shows a flowchart of a process for selecting one implementation from alternative implementations.

FIG. 3 shows a flowchart of a process for selecting one implementation from alternative implementations. The alternative implementations may be for different types of architectures of devices and/or for different optimizations. The process of FIG. 3 may be performed as part of the processing associated with block 210 of FIG. 2.

At decision block 302, if there is only one implementation associated with a matched pattern, that implementation is selected at block 303. Otherwise, if there is more than one implementation associated with a matched pattern and a device type is specified for the circuit design, decision block 304 directs the process to decision block 306. The implementation(s) for the device type is selected at block 308. The device type may be specified as a comment in the circuit design or as another type of input value to a synthesis tool. If there are no implementations available for the specified device type, a default implementation may be selected at block 316 and a warning message output. Alternatively, the process of generating a netlist may be stopped and an error message output.

A design parameter may be specified for optimizing the synthesized netlist in terms of timing, power consumption, or area, for example. The parameter may be specified by a comment in the design specification or by other input mechanism as described above. If an optimization is specified, decision block 310 directs the process to decision block 312 to check whether or not there is an implementation for the desired optimization. If there is an implementation for the desired optimization, the implementation is selected at block 314. If there is no implementation available for the specified optimization, at block 316 a default implementation may be selected and a warning message output, or the synthesis process may be stopped with an error message.

If there are multiple implementations associated with a matched pattern (decision block 302), and no optimization was specified (decision block 310), a default implementation may be selected at block 316 and a warning message output.

Figure 4:
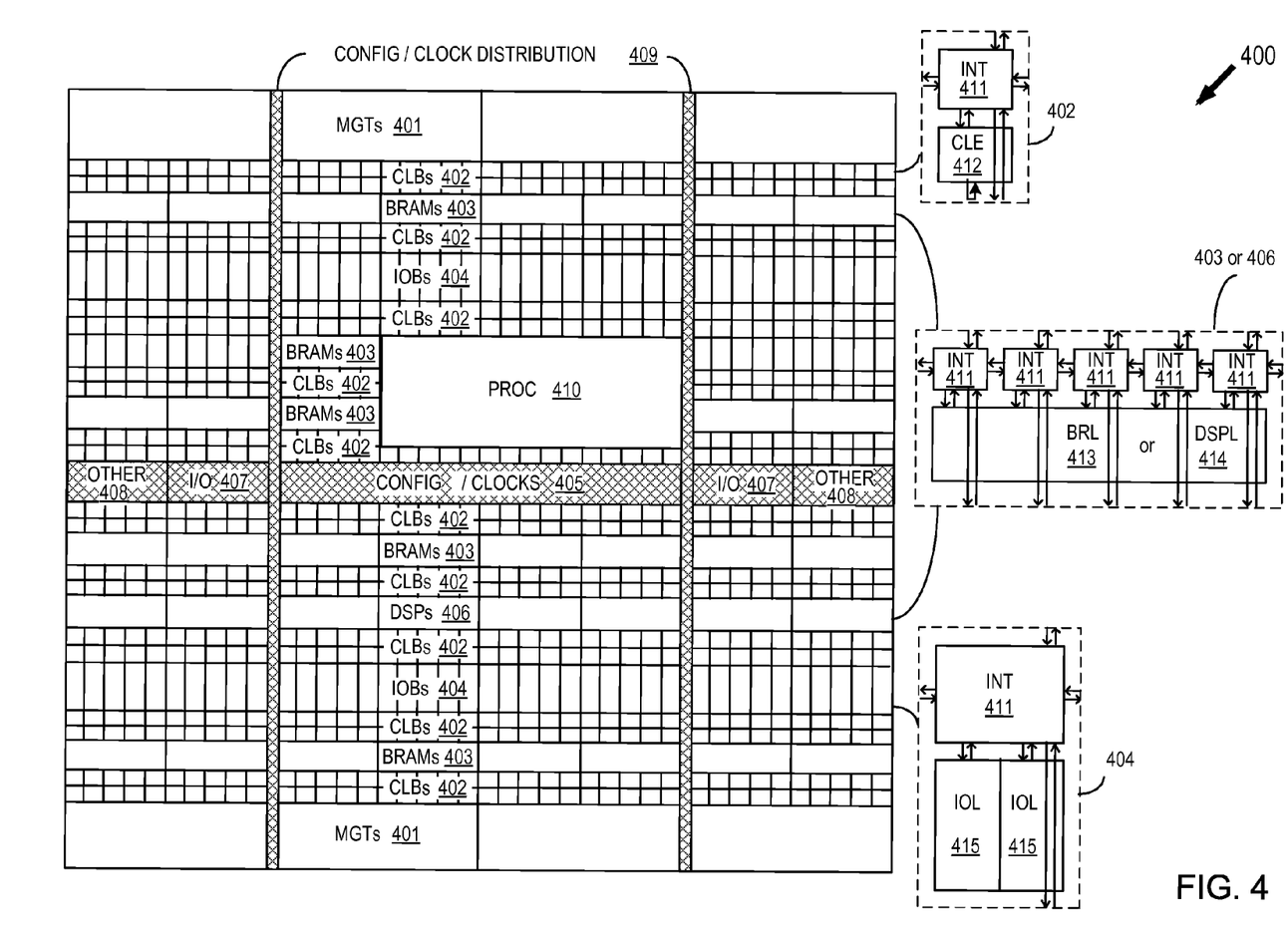
FIG. 4 shows an example field programmable gate array (FPGA) for which a circuit design may be targeted.

FIG. 4 shows an example field programmable gate array (FPGA) for which a circuit design may be targeted. FPGAs can include several different types of programmable logic blocks in the array. For example, FIG. 4 illustrates an FPGA architecture (400) that includes a large number of different programmable tiles including multi-gigabit transceivers (MGTs 401), configurable logic blocks (CLBs 402), random access memory blocks (BRAMs 403), input/output blocks (IOBs 404), configuration and clocking logic (CONFIG/CLOCKS 405), digital signal processing blocks (DSPs 406), specialized input/output blocks (I/O 407), for example, e.g., clock ports, and other programmable logic 408 such as digital clock managers, analog-to-digital converters, system monitoring logic, and so forth. Some FPGAs also include dedicated processor blocks (PROC 410) and internal and external reconfiguration ports (not shown).

In some FPGAs, each programmable tile includes a programmable interconnect element (INT 411) having standardized connections to and from a corresponding interconnect element in each adjacent tile. Therefore, the programmable interconnect elements taken together implement the programmable interconnect structure for the illustrated FPGA. The programmable interconnect element INT 411 also includes the connections to and from the programmable logic element within the same tile, as shown by the examples included at the top of FIG. 4.

For example, a CLB 402 can include a configurable logic element CLE 412 that can be programmed to implement user logic plus a single programmable interconnect element INT 411. A BRAM 403 can include a BRAM logic element (BRL 413) in addition to one or more programmable interconnect elements. Typically, the number of interconnect elements included in a tile depends on the width of the tile. In the pictured FPGA, a BRAM tile has the same width as five CLBs, but other numbers (e.g., four) can also be used. A DSP tile 406 can include a DSP logic element (DSPL 414) in addition to an appropriate number of programmable interconnect elements. An 10B 404 can include, for example, two instances of an input/output logic element (IOL 415) in addition to one instance of the programmable interconnect element INT 411. As will be clear to those of skill in the art, the actual I/O pads connected, for example, to the I/O logic element 415 are manufactured using metal layered above the various illustrated logic blocks, and typically are not confined to the area of the input/output logic element 415.

In the pictured FPGA, a horizontal area near the center of the die (shown shaded in FIG. 4) is used for configuration, clock, and other control logic. Vertical areas 409 extending from this horizontal area are used to distribute the clocks and configuration signals across the breadth of the FPGA.

Some FPGAs utilizing the architecture illustrated in FIG. 4 include additional logic blocks that disrupt the regular row structure making up a large part of the FPGA. The additional logic blocks can be programmable blocks and/or dedicated logic. For example, the processor block PROC 410 shown in FIG. 4 spans several rows of CLBs and BRAMs.

Note that FIG. 4 is intended to illustrate only an exemplary FPGA architecture. The numbers of logic blocks in a row, the relative heights of the rows, the number and order of rows, the types of logic blocks included in the rows, the relative sizes of the logic blocks, and the interconnect/logic implementations included at the top of FIG. 4 are purely exemplary. For example, in an actual FPGA more than one adjacent row of CLBs is typically included wherever the CLBs appear, to facilitate the efficient implementation of user logic.

Figure 5:
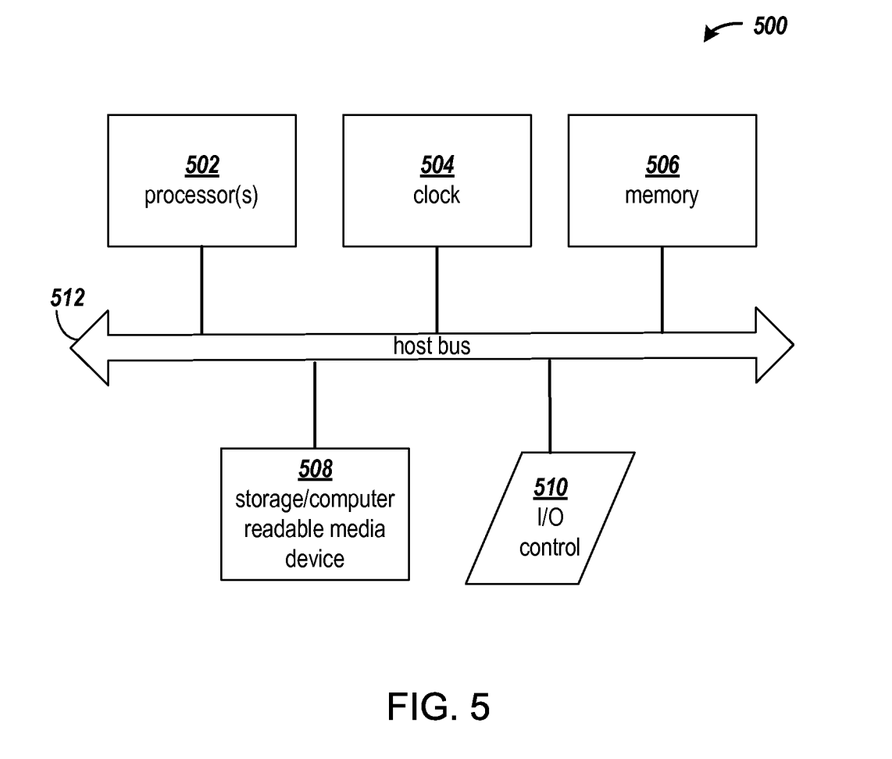
FIG. 5 shows an example computing arrangement on which the processes and data structures disclosed herein may be implemented.

FIG. 5 shows an example computing arrangement on which the processes and data structures disclosed herein may be implemented. It will be appreciated that various alternative computing arrangements, including one or more processors and a memory arrangement configured with program code, would be suitable for hosting the disclosed processes and data structures. The computer code, which implements the disclosed processes, is encoded in a processor executable format and may be stored and provided via a variety of computer-readable storage media or delivery channels such as magnetic or optical disks or tapes, electronic storage devices, or as application services over a network.

Processor computing arrangement 500 includes one or more processors 502, a clock signal generator 504, a memory arrangement 506, a storage arrangement 508, and an input/output control unit 510, all coupled to a host bus 512. The arrangement 500 may be implemented with separate components on a circuit board or may be implemented internally within an integrated circuit. When implemented internally within an integrated circuit, the processor computing arrangement is otherwise known as a microcontroller.

The architecture of the computing arrangement depends on implementation requirements as would be recognized by those skilled in the art. The processor(s) 502 may be one or more general purpose processors, or a combination of one or more general purpose processors and suitable co-processors, or one or more specialized processors (e.g., RISC, CISC, pipelined, etc.).

The memory arrangement 506 typically includes multiple levels of cache memory, and a main memory. The storage arrangement 508 may include local and/or remote persistent storage, such as provided by magnetic disks (not shown), flash, EPROM, or other non-volatile data storage. The storage unit may be read or read/write capable. Further, the memory arrangement 506 and storage arrangement 508 may be combined in a single arrangement.

The processor(s) 502 executes the software in storage arrangement 508 and/or memory arrangement 506, reads data from and stores data to the storage arrangement 508 and/or memory arrangement 506, and communicates with external devices through the input/output control arrangement 510. These functions are synchronized by the clock signal generator 504. The resource of the computing arrangement may be managed by either an operating system (not shown), or a hardware control unit (not shown).

Though embodiments may in some cases be described in individual figures, it will be appreciated that features from one figure can be combined with features of another figure even though the combination is not explicitly shown or explicitly described as a combination. Other aspects and embodiments will be apparent to those skilled in the art from consideration of the specification. The embodiments may be implemented as one or more processors configured to execute software, as an application specific integrated circuit (ASIC), or as a logic on a programmable logic device. It is intended that the specification and illustrated embodiments be considered as examples only, with a true scope of the invention being indicated by the following claims.

What is claimed is:

1. A data-driven method of processing a circuit design, comprising:
    inputting one or more input patterns in a first format to a programmed processor;
    converting each pattern of the one or more input patterns from the first format into a second format by the programmed processor, wherein each pattern identifies one or more inputs and one or more outputs and specifies each function that generates each of the one or more outputs from the one or more inputs;
    storing each pattern of the second format in a database;
    for an input circuit design, searching for circuit design elements in the circuit design that match patterns in the database; and
    outputting data indicative of each pattern in the database that matches a circuit design element.

2. The method of claim 1, further comprising:
    for each pattern in the database that matches a circuit design element in the circuit design:
        reading each implementation parameter value of the circuit design element from the circuit design; and
        storing each implementation parameter value in association with an identifier of the pattern.

3. The method of claim 2, further comprising:
    associating patterns in the database with respective implementations; and
    for each stored identifier of a pattern in the database, generating a respective synthesized netlist using each associated implementation parameter value and the associated respective implementation.

4. The method of claim 3, wherein the respective implementations are for programmable logic of a programmable integrated circuit.

5. The method of claim 3, further comprising:
storing each synthesized netlist in another database;
synthesizing parts of the circuit design other than the circuit design elements in the circuit design that match patterns in the database; and
combining each synthesized netlist from the other database with the synthesized parts of the circuit design.

6. The method of claim 3, wherein the generating of the respective synthesized netlist using each associated implementation parameter value includes generating a plurality of respective synthesized netlists in parallel.

7. The method of claim 2, wherein at least one of the input patterns specifies an exact pattern and at least one of the input patterns specifies an inexact pattern.

8. The method of claim 7, wherein the reading of each implementation parameter value of the circuit design element from the circuit design includes reading an implementation parameter value for a circuit design element that matches the inexact pattern.

9. The method of claim 1, wherein the outputting of data indicative of each pattern in the database that matches a circuit design element includes outputting respective numeric values of numbers of circuit design elements that match the patterns in the database.

10. The method of claim 1, further comprising:
for each pattern in the database that matches a circuit design element of the circuit design:
reading each implementation parameter value of the circuit design element from the circuit design; and
storing each implementation parameter value in association with an identifier of the pattern;
associating patterns in the database with respective implementations, wherein at least one of the patterns has two or more associated alternative implementations;
for each stored identifier of a pattern having one associated implementation, generating a respective synthesized netlist using each associated implementation parameter value and the associated respective implementation; and
for each stored identifier of the at least one pattern having two or more associated alternative implementations, selecting one of the two or more associated alternative implementations, and generating a respective synthesized netlist using each associated implementation parameter value and the selected one of the two or more associated alternative implementations.

11. The method of claim 10, wherein each one of the two or more associated alternative implementations is for a different type of target programmable integrated circuit.

12. The method of claim 10, wherein each one of the two or more associated alternative implementations is for one of optimizing timing, area, or power consumption.

13. The method of claim 1, wherein the first format is register transfer language (RTL).

14. The method of claim 1, further comprising recognizing the one or more input patterns in a plurality of sample circuit designs.

15. A system for data-driven processing of a circuit design, comprising:
a processor;
a memory arrangement coupled to the processor, the memory arrangement configured with instructions that when executed by the processor cause the processor to perform operations including:
inputting one or more input patterns in a first format to a programmed processor;
converting each pattern of the one or more input patterns from the first format into a second format by the programmed processor, wherein each pattern identifies one or more inputs and one or more outputs and specifies each function that generates each of the one or more outputs from the one or more inputs;
storing each pattern of the second format in a database;
for an input circuit design, searching for circuit design elements in the circuit design that match patterns in the database;
outputting data indicative of each pattern in the database that matches a circuit design element.

16. The system of claim 15, the operations further comprising:
for each pattern in the database that matches a circuit design element:
reading each implementation parameter value of the circuit design element from the circuit design; and
storing each implementation parameter value in association with an identifier of the pattern.

17. The system of claim 16, the operations further comprising:
associating patterns in the database with respective implementations; and
for each stored identifier of a pattern, generating a respective synthesized netlist using each associated implementation parameter value and the associated respective implementation.

18. The system of claim 17, wherein the generating of the respective synthesized netlist using each associated implementation parameter value includes generating a plurality of respective synthesized netlists in parallel.

19. The system of claim 15, wherein the outputting of data indicative of each pattern in the database that matches a circuit design element includes outputting respective numeric values of numbers of circuit design elements that match the patterns in the database.

20. The system of claim 15, the operations further comprising:
for each pattern in the database that matches a circuit design element:
reading each implementation parameter value of the circuit design element from the circuit design; and
storing each implementation parameter value in association with an identifier of the pattern;
associating patterns in the database with respective implementations, wherein at least one of the patterns has two or more associated alternative implementations;
for each stored identifier of a pattern having one associated implementation, generating a respective synthesized netlist using each associated implementation parameter value and the associated respective implementation; and
for each stored identifier of the at least one pattern having two or more associated alternative implementations, selecting one of the two or more associated alternative implementations, and generating a respective synthesized netlist using each associated implementation parameter value and the selected one of the two or more associated alternative implementations.

* * * * *